United States Patent
Lee

(10) Patent No.: US 7,363,555 B2
(45) Date of Patent: Apr. 22, 2008

(54) MEMORY CELL TEST CIRCUIT FOR USE IN SEMICONDUCTOR MEMORY DEVICE AND ITS METHOD

(75) Inventor: Chang-Hyuk Lee, Kyoungki-do (KR)

(73) Assignee: Hynix Semiconductor, Inc., Kyoungki-do (KR)

(*) Notice: Subject to any disclaimer, the term of this patent is extended or adjusted under 35 U.S.C. 154(b) by 236 days.

(21) Appl. No.: 11/020,492

(22) Filed: Dec. 21, 2004

(65) Prior Publication Data
US 2006/0085703 A1  Apr. 20, 2006

(30) Foreign Application Priority Data
Oct. 15, 2004  (KR) ............... 10-2004-0082548

(51) Int. Cl.
*G11C 29/00* (2006.01)
(52) U.S. Cl. .............. 714/718; 714/719; 714/710; 714/721; 714/723
(58) Field of Classification Search ............ None
See application file for complete search history.

(56) References Cited

U.S. PATENT DOCUMENTS

| | | | |
|---|---|---|---|
| 5,920,573 A * | 7/1999 | Dorney ............... | 714/719 |
| 5,928,373 A * | 7/1999 | Yoo .................. | 714/719 |
| 6,144,598 A | 11/2000 | Cooper et al. | |
| 6,163,863 A | 12/2000 | Schicht | |
| 6,285,790 B1 | 9/2001 | Schwartz | |
| 6,446,227 B1 * | 9/2002 | Hashimoto .......... | 714/719 |
| 6,530,045 B1 * | 3/2003 | Cooper et al. ........ | 714/719 |
| 6,584,025 B2 | 6/2003 | Roohparvar et al. | |
| 6,587,391 B2 * | 7/2003 | Jung et al. ........ | 365/230.03 |
| 6,754,118 B2 | 6/2004 | Cowles et al. | |
| 6,947,340 B2 * | 9/2005 | Park ................ | 365/194 |
| 6,950,971 B2 * | 9/2005 | Boehler et al. ....... | 714/710 |
| 7,055,077 B2 * | 5/2006 | Kiryu et al. ........ | 714/726 |
| 2001/0021129 A1 * | 9/2001 | Ishikawa ........... | 365/189.12 |
| 2002/0044487 A1 | 4/2002 | Roohparvar et al. | |
| 2004/0255211 A1 | 12/2004 | Cooper et al. | |
| 2005/0047264 A1 * | 3/2005 | Lee ................ | 365/233 |

FOREIGN PATENT DOCUMENTS

JP  11-149799  6/1999
KR  100221073 B1  6/1999

* cited by examiner

*Primary Examiner*—Cynthia Britt
*Assistant Examiner*—Guerrier Merant
(74) *Attorney, Agent, or Firm*—Blakely, Sokoloff, Taylor & Zafman LLP

(57) ABSTRACT

A memory cell test circuit for use in a semiconductor memory device having a plurality of banks connected to a plurality of global input/output lines, including: a plurality of bank switching units for transferring data outputted from the plurality of banks to the plurality of global input/output lines based on a test mode signal and a plurality of control clock signals; a logic operation unit for performing a logic operation to the data outputted to the plurality of global input/output lines and for outputting a result of the logic operation to a test global input/output line; and a switching unit coupled to the test global input/output line and the plurality of global input/output lines for selectively passing data of the test global input/output line and data of the global input/output lines based on the test mode signal and the plurality of control clock signals.

27 Claims, 8 Drawing Sheets

MEMORY CELL TEST CIRCUIT FOR USE IN SEMICONDUCTOR MEMORY DEVICE AND ITS METHOD

FIELD OF INVENTION

The present invention relates to a semiconductor device; and, more particularly, to a circuit for testing a memory cell included in a semiconductor memory device.

DESCRIPTION OF PRIOR ART

As a semiconductor memory device is highly integrated, a test time taken for testing memory cells included in the semiconductor memory device is increased. Therefore, recently, a testing circuit cable of testing a plurality of memory cells at a time has been developed. That is, the testing circuit tests a plurality of memory cells by inputting a same logic data to the plurality of memory cells and detecting output logic value generated by performing a logic operation to output values of the plurality of memory cells.

FIG. 1 is a block diagram showing a conventional single data rate synchronous semiconductor memory (SDR SDRAM) device for testing a memory cell. Herein, it is assumed that the conventional SDR SDRAM includes two banks.

As shown, the conventional SDR SDRAM includes a first bank 110, a first amplification/logic operation unit 120, a second bank 130, a second amplification/logic operation unit 140, a pipe register unit 150 and a data out driver unit 160.

Although not shown in FIG. 1, the first and the second banks 110 and 130 include a plurality of memory cells for storing data and receive an address signal, a plurality of command signals and a test mode signal tm.

The first amplification/logic operation unit 120 receives data from the first bank 110 through a plurality of first bank local input/output lines lio0_bk0 to lio3_bk0 and outputs the received data to a first to a fourth global input/output lines gio<0> to gio<3>.

Similarly, the second amplification/logic operation unit 140 receives data from the second bank 130 through a plurality of second bank local input/output lines lio0_bk1 to lio3_bk1 and outputs the received data to the first to the fourth global input/output lines gio<0> to gio<3>.

The pipe register unit 150 includes a plurality of pipe registers connected to the first to the fourth global input/output lines gio<0> to gio<3>. The data out driver unit 160 includes a plurality of data out drivers for transferring data outputted from the pipe register unit 150 to a data output pin.

If the test mode signal tm is inactivated and a read command signal is inputted to the first bank 110, a first bank address signal bank_a0 is activated and the data outputted to the plurality of first bank local input/output lines lio0_bk0 to lio3_bk3 is amplified. Meanwhile, data outputted to the plurality of second bank local input/output lines lio0_bk1 to lio3_bk3 is precharged to a logic high level.

Similarly, when the test mode signal tm is inactivated and the read command signal is inputted to the second bank 130, a second bank address signal bank_a1 is activated and the data outputted to the plurality of second bank local input/output lines lio0_bk1 to lio3_bk1 is amplified. At this time, the data outputted to the plurality of first bank local input/output lines lio0_bk0 to lio3_bk0 is precharged to a logic high level.

If the test modes signal tm is activated and the read command signal is inputted, both the data outputted to the plurality of first bank local input/output lines lio0_bk0 to lio3_bk0 and the data outputted to the plurality of second bank local input/output lines lio0_bk1 to lio0_bk1 are amplified regardless of signal levels of the first and the second bank address signals bank_a0 and bank_a1.

The first amplification/logic operation unit 120 includes a first input/output sense amplifier unit 121 including a plurality of input/output sense amplifiers for amplifying the data outputted to the plurality of first bank local input/output lines lio0_bk0 to lio3_bk0; a first switch unit 123 including a first to a fourth data line switches sw0_0 to sw0_3 for transferring an output signal of the first input/output sense amplifier unit 120 to the first to the fourth global input/output lines gio<0> to gio<3> or a first bank first to a fourth test global input/output lines tgio_bk0<0> to tgio_bk0<3> based on the test mode signal tm; and a first logic operation unit 125 for performing a logic operation to output signals of the first to the fourth data lines switches sw0_0 to sw0_3 and for outputting the result of the logic operation to the fourth global input/output line gio<3>. Herein, an output of the fourth data line switch sw0_3 and an output of the first logic operation unit 125 are commonly connected to the fourth global input/output lines gio<3>.

When the test mode signal tm is activated, the first data line switch sw0_0 transfers an output signal of the first input/output sense amplifier unit 121 to the first bank first test global input/output line tgio_bk0<0> and precharges the first global input/output lines gio<0> to a logic high level. On the contrary, when the test mode signal tm is inactivated, the first data line switch sw0_0 transfers the output signal of the first input/output sense amplifier unit 121 to the first global input/output line gio<0> and precharges the first bank first test global input/output line tgio_bk0<0> to a logic high level.

Meanwhile, the second to the fourth data line switches $sw_0\_1$ to sw0_3 have the same structure with the first data line switch sw0_0.

The first logic operation unit 125 included a first exclusive NOR gate 126, a second exclusive NOR gate 127, a first AND gate 128 and a first switch sw1.

The first exclusive NOR gate 126 performs a logic exclusive NOR operation to the data outputted to the first bank first test global input/output line tgio_bk0<0> and the data outputted to the first bank second test global input/output line tgio_bk0<1>. Likewise, the second exclusive NOR gate 127 performs a logic exclusive NOR operation to the data outputted to the first bank third test global input/output line tgio_bk0<2> and the data outputted to the first bank fourth test global input/output line tgio_bk0<3>.

The first AND gate performs a logic AND operation to an output signal of the first exclusive NOR gate 126 and an output signal of the second exclusive NOR gate 127 and outputs the result of the logic AND operation to the first switch sw1. Then, the first switch sw1 transfers an output signal, i.e., the result of the logic AND operation to the fourth global input/output line gio<3> in response to the test mode signal tm. Herein, when the test mode signal tm is activated, the first switch sw1 transfers the output signal of the first AND gate 128 to the fourth global input/output line gio<3>. On the contrary, when the test mode signal tm is inactivated, an output terminal of the first switch sw1 becomes a high impedance.

The second amplification/logic operation unit 140 includes a second input/output sense amplifier unit 141 including a plurality of input/output sense amplifiers for amplifying the data outputted to the plurality of second bank local input/output lines lio0_bk1 to lio3_bk1; a second switch unit 143 including a fifth to an eighth data line switches sw1_0 to sw1_3 for transferring an output signal of the second input/output sense amplifier unit 141 to the first to the fourth global input/output lines gio<0> to gio<3> or a second bank first to a fourth test global input/output lines tgio_bk1<0> to tgio_bk1<3> based on the test mode signal tm; and a second logic operation unit 145 for performing a logic operation to output signals of the fifth to the eighth data lines switches sw1_0 to sw1_3 and for outputting the result of the logic operation to the third global input/output line gio<2>. Herein, an output of the seventh data line switch sw1_2 and an output of the second logic operation unit 145 are commonly connected to the third global input/output lines gio<2>.

The second logic operation unit 145 includes a third exclusive NOR gate 146, a fourth exclusive NOR gate 147, a second AND gate 148 and a second switch sw2.

Since the second amplification/logic operation unit 140 has the same structure and operations with the first amplification/logic operation unit 120 except that the output of the seventh data line switch sw1_2 and the output of the second logic operation unit 145 are commonly connected to the third global input/output lines gio<2>, detailed descriptions of the second amplification/logic operation unit 140 are omitted.

FIG. 2 is a timing diagram showing operations of the conventional SDR SDRAM shown in FIG. 1 when the test mode signal tm is inactivated.

When the read command signal is inputted to the first bank 110 in synchronization with a clock signal clk, the first input/output sense amplifier unit 121 amplifies the data outputted to the plurality of first bank local input/output lines lio<0>_bk0 to lio<3>_bk0. Then, since the test mode signal tm is inactivated, the first switch unit 123 transfers the amplified data to the first to the fourth global input/output lines gio<0> to gio<3> and precharges the first bank first to the fourth test global input/output lines tgio_bk0<0> to tgio_bk0<3> to a logic high level.

Since the test mode signal tm is inactivated, the output terminal of the first switch sw1 becomes a high impedance. Therefore, an output signal of the fourth data line switch sw0_3 is loaded on the fourth global input/output line gio<3> regardless of the output of the first logic operation unit 125. That is, the data amplified by the first input/output sense amplifier unit 121 is loaded on the first to the fourth global input/output lines gio<0> to gio<3> by the first switch unit 123.

Similarly, when the read command is inputted to the second bank 130 in synchronization with the clock signal clk, the data outputted to the plurality of second bank local input/output lines lio0_bk1 to lio3_bk1 is amplified by the second input/output sense amplifier unit 141. Then, the amplified data is loaded on the first to the fourth global input/output lines gio<0> to gio<3> by the second switch unit 143.

FIG. 3 is a timing diagram showing operations of the conventional SDR SDRAM shown in FIG. 1 when the test mode signal is activated.

In this case, the first and the second banks 110 and 130 output a data as a same logic level at a same clock. For example, the data loaded on the plurality of first bank local input/output lines lio0_bk0 to lio3_bk0 are in a logic high level at a first clock and are in a logic low level at a second clock. Herein, it is assumed that the data loaded on the plurality of first bank local input/output lines lio0_bk0 to lio3_bk0 and the data loaded on the plurality of second bank local input/output lines lio0_bk1 to lio3_bk1 are in a logic high level at the first clock and are in a logic low level at the second clock.

When the read command is inputted, the data loaded on the plurality of first bank local input/output lines lio0_bk0 to lio3_bk0 and the data loaded on the plurality of second bank local input/output lines lio0_bk1 to lio3_bk1 are amplified and precharged at the same time in synchronization with the first clock and the second clock since both the first and the second banks 110 and 130 are enabled regardless of the first and the second bank address signals bank_a0 and bank_a1.

The first switch unit 123 transfers the data outputted from the first input/output sense amplifier unit 121 to the first bank first to fourth test global input/output lines tgio_bk0<0> to tgio_bk0<0>, and the first to the fourth global input/output lines become a high impedance.

Therefore, if all of the data loaded on the first bank first to fourth local input/output lines lio0_bk0 to lio3_bk0 are in a logic high level or in a logic low level, which means there is no error, output signals of the first and the second exclusive NOR gates 126 and 127 becomes a logic high level and an output signal of the first AND gate 128 also becomes a logic high level.

If one of the data loaded on the first bank first to fourth local input/output lines lio0_bk0 to lio3_bk0 is in a different logic level, the output signal of the first AND gate 128 becomes a logic low level. That is, the output signal of the first AND gate 128 determines whether or not the data loaded on the first bank first to fourth local input/output lines lio0_bk0 to lio3_bk0 are in a same logic level. The output signal of the first AND gate 128 is passed to the fourth global input/output line gio<3>.

Similarly, an output signal of the second AND gate 148 determines whether or not the data loaded on the second bank first to fourth local input/output lines lio0_bk1 to lio3_bk1 are in a same logic level. Then, the output signal of the second AND gate 148 is passed to the third global input/output line gio<2>.

Herein, the first and the second global lines gio<0> and gio<1> are in a high impedance state since the test mode signal tm is activated.

Therefore, when the test mode signal tm is activated, the conventional SDR SDRAM can detect an abnormally operated memory cell by determining whether or not data loaded on all the local input/output lines included in a bank are in a same logic level.

However, as above-mentioned, each bank of the conventional SDR SDRAM includes test global input/output lines and a logic operation unit increasing a size of the conventional SDR SDRAM. Further, if above-mentioned test circuits are used in a double data rate (DDR) SDRAM or DDR2 SDRAM, a size for the test circuits is more increased.

SUMMARY OF INVENTION

It is, therefore, an object of the present invention to provide a test circuit for testing a memory cell not increasing a size of a semiconductor memory device.

In accordance with an aspect of the present invention, there is provided a memory cell test circuit for use in a semiconductor memory device having a plurality of banks connected to a plurality of global input/output lines, including: a plurality of bank switching units for transferring data outputted from the plurality of banks to the plurality of global input/output lines based on a test mode signal and a plurality of control clock signals; a logic operation unit for performing a logic operation to the data outputted to the plurality of global input/output lines and for outputting a result of the logic operation to a test global input/output line; and a switching unit coupled to the test global input/output line and the plurality of global input/output lines for selectively passing data of the test global input/output line and data of the global input/output lines based on the test mode signal and the plurality of control clock signals.

In accordance with another aspect of the present invention, there is provided a method for testing a memory cell included in a semiconductor memory device having a plurality of banks, including the steps of: a) generating a first control clock signal and a second control clock signal based on a test mode signal and an input clock signal; b) outputting data from the plurality of banks as a same logic level to a plurality of local input/output lines of the plurality of banks in response to the test mode signal; c) outputting data outputted from the plurality of local input/output lines to a first to a fourth global input/output lines in response to a first control clock signal and a second control clock signal; and d) performing a logic operation to data of the first to the fourth global input/output lines and outputting a result of the logic operation to a test global input/output line.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a memory cell test circuit test circuit in accordance with the present invention will be described in detail referring to the accompanying drawings.

Figure 4:
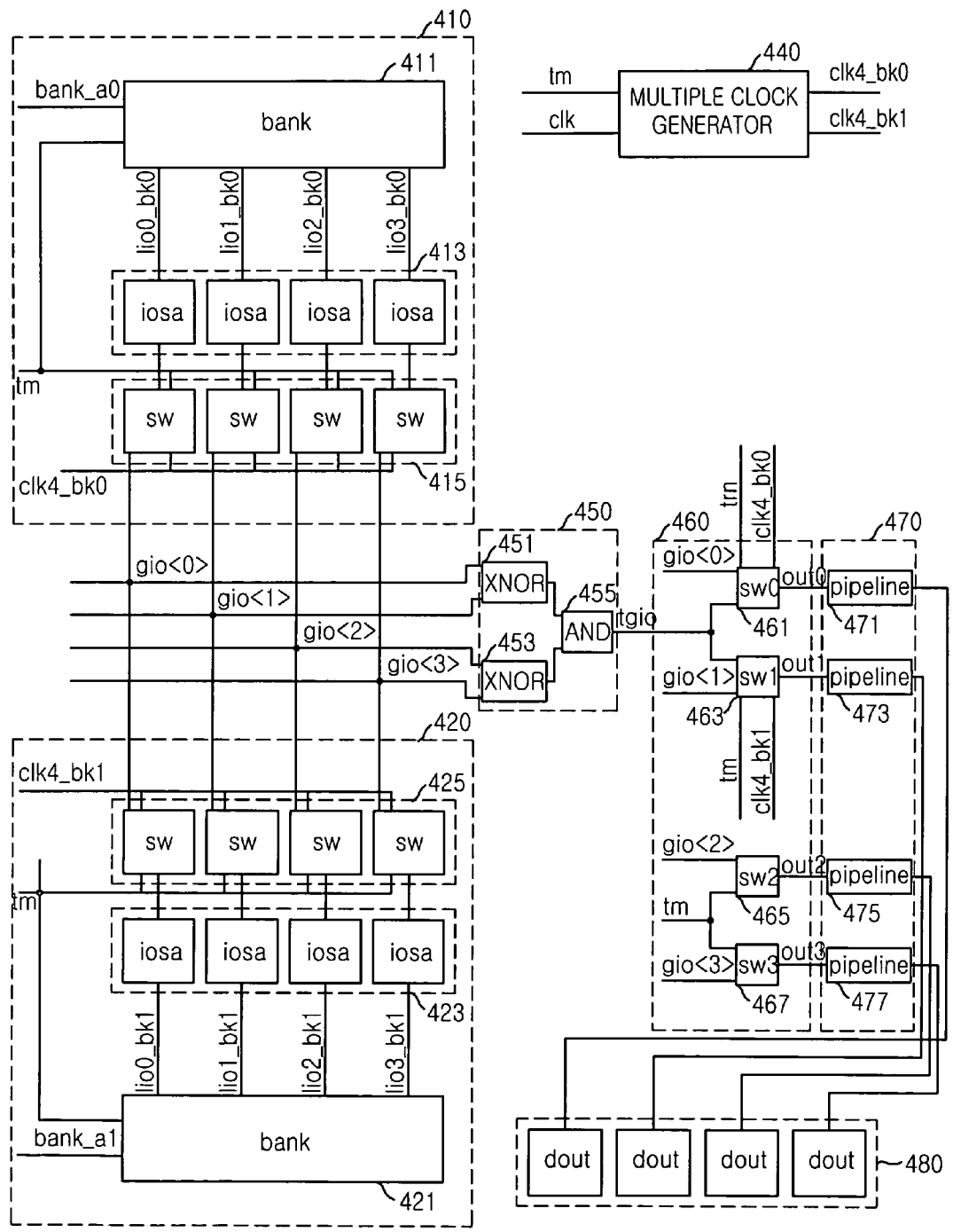
FIG. 4 is a block diagram showing a semiconductor memory device including a memory cell test circuit in accordance with a preferred embodiment of the present invention.

FIG. 4 is a block diagram showing a semiconductor memory device including a memory cell test circuit in accordance with a preferred embodiment of the present invention.

As shown, the semiconductor memory device includes a first bank unit 410, a second bank unit 420, a multiple clock generator 440, a logic operation unit 450, a switching unit 460, a pipe line unit 470 and a data output unit 480.

The first bank unit 410 includes a first bank 411 having a plurality of memory cells for outputting data to a first bank first to a first bank fourth local input/output lines lio0_bk0 to lio3_bk0; a first input/output sense amplifier (IOSA) unit 413 for amplifying a signal level of the data outputted to the first bank first to the first bank fourth local input/output lines lio0_bk0 to lio3_bk0; and a first bank switching unit 415 for transferring an output of the first input/output sense amplifier unit 413 to a plurality of global lines, i.e., a first to a fourth global lines gio<0> to gio<3> in response to a test mode signal tm and a first control clock signal clk4_bk0.

The first bank 411 outputs four data at a time accNORding to a burst length when the test mode signal tm is activated. When the test mode signal tm is inactivated, a data is outputted to a corresponding local input/output line according to a first bank address signal bank_a0 and the other local input/output lines are precharged to a logic high level.

The first switching unit 415 latches an output of the first input/output sense amplifier unit 413 and outputs the latched signal in synchronization with a rising edge of the first control clock signal clk4_bk0 when the test mode signal tm is activated. Herein, while the first control signal clk4_bk0 is in a logic low level, an output of the first switching unit 415 becomes a high impedance. Meanwhile, when the test mode signal tm is inactivated, the switching unit 415 passes the output of the first input/output sense amplifier unit 413 to the first to the fourth global input/output lines gio<0> to gio<3>.

Likewise, the second bank unit 420 includes a second bank 421 having a plurality of memory cells for outputting data to a second bank first to a second bank fourth local input/output lines lio0_bk1 to lio3_bk1; a second input/output sense amplifier unit 423 for amplifying a signal level of the data outputted to the second bank first to the second bank fourth local input/output lines lio0_bk1 to lio3_bk1; and a second bank switching unit 425 for transferring an output of the second input/output sense amplifier unit 423 to the first to the fourth global lines gio<0> to gio<3> in response to the test mode signal tm and a second control clock signal clk4_bk1.

Since the second bank unit 420 has the same structure and operations with the first bank unit 410, detailed descriptions of the second bank unit 420 are omitted.

The multiple clock generator 440 generates the first control clock signal clk4_bk0 in synchronization with a rising edge of an internal clock signal clk when the test mode signal tm is activated. The second control clock signal clk4_bk1 can be generated in synchronization with a falling edge of the first control clock signal clk4_bk0. The multiple clock generator 440 also generates a first and a second delayed control clock signals clk4_bk0_d and clk4_bk1_d by delaying the first and the second control clock signals clk4_bk0 and clk4_bk1. When the test mode signal tm is inactivated, the multiple clock generator 440 is disabled in response to the test mode signal tm. Herein, although not shown in FIG. 4, the multiple clock generator 440 includes a delay element for generating the first and the second delayed control clock signals clk4_bk0_d and clk4_bk1_d.

The logic operation unit 450 includes a first exclusive NOR gate 451 for performing a logic exclusive NOR operation to a data of the first global input/output line gio<0> and a data of the second global input/output line gio<1>; a second exclusive NOR gate 453 for performing a logic exclusive NOR operation to a data of the third global input/output line gio<2> and a data of the fourth global input/output line gio<3>; and an AND gate 455 for performing a logic AND operation to outputs of the first and the second exclusive logic NOR gates 451 and 453 in order to output the result of the logic AND operation to a test global input/output line tgio.

The switching unit 460 includes a first to a fourth switches 461 to 467.

The first switch 461 passes one of the data of the test global input/output line tgio and the data of the first global input/output line gio<0> to a first output line out0 based on the test mode signal tm and the first control clock signal clk4_bk0. Likewise, the second switch 463 passes one of the data of the test global input/output line tgio and the data of the second global input/output line gio<1> to a second output line out1 based on the test mode signal tm and the second control clock signal clk4_bk1. The third switch 465 passes the data of the third global input/output line gio<2>to a third output line out2 in response to the test mode signal tm. Likewise, the fourth switch 467 passes the data of the fourth global input/output line gio<3> to a fourth output line out3 in response to the test mode signal tm.

Figure 5:
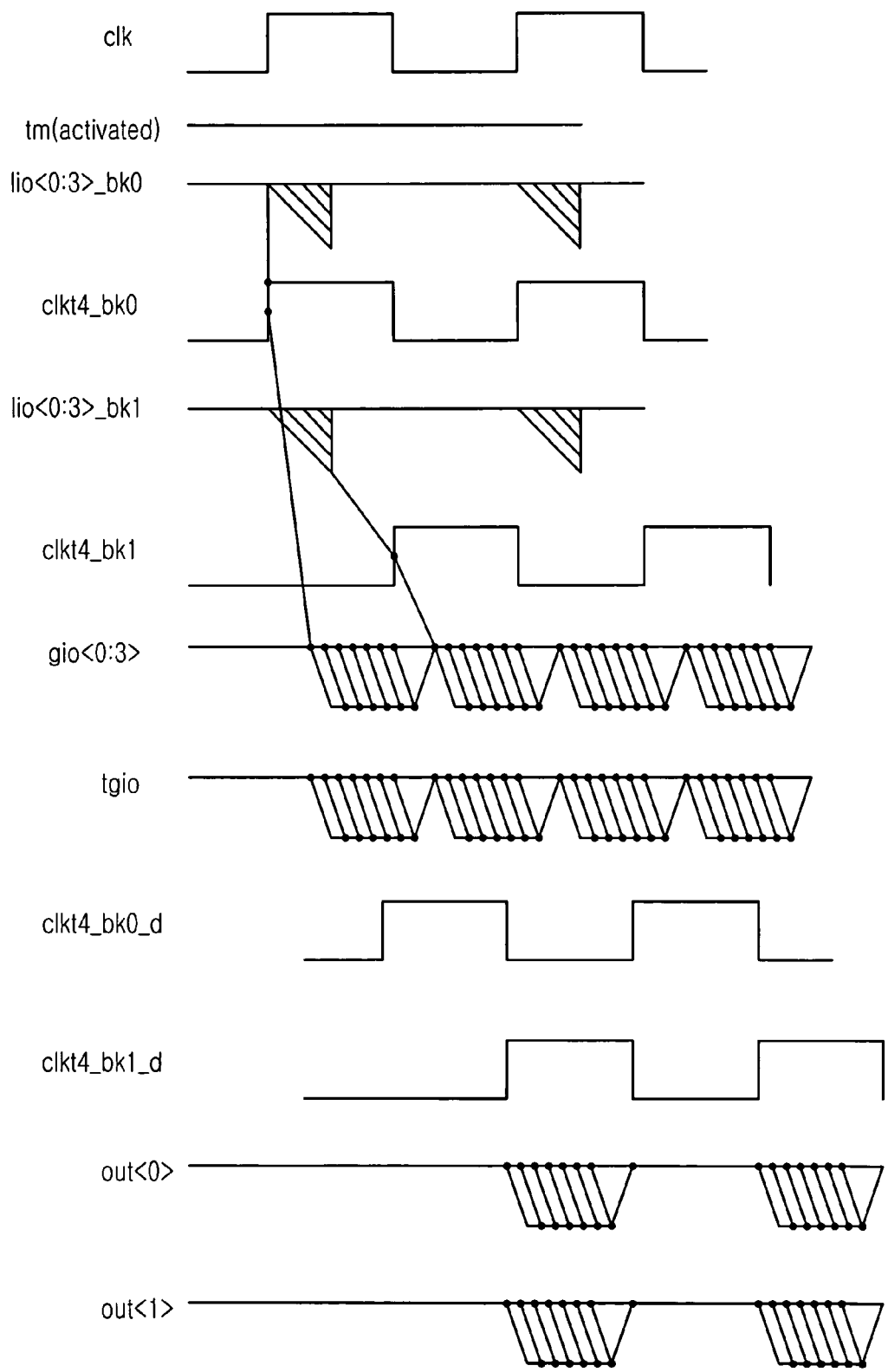
FIGS. 5 and 6 are timing diagrams showing operations of the semiconductor memory device in accordance with the present invention.
Figure 6:
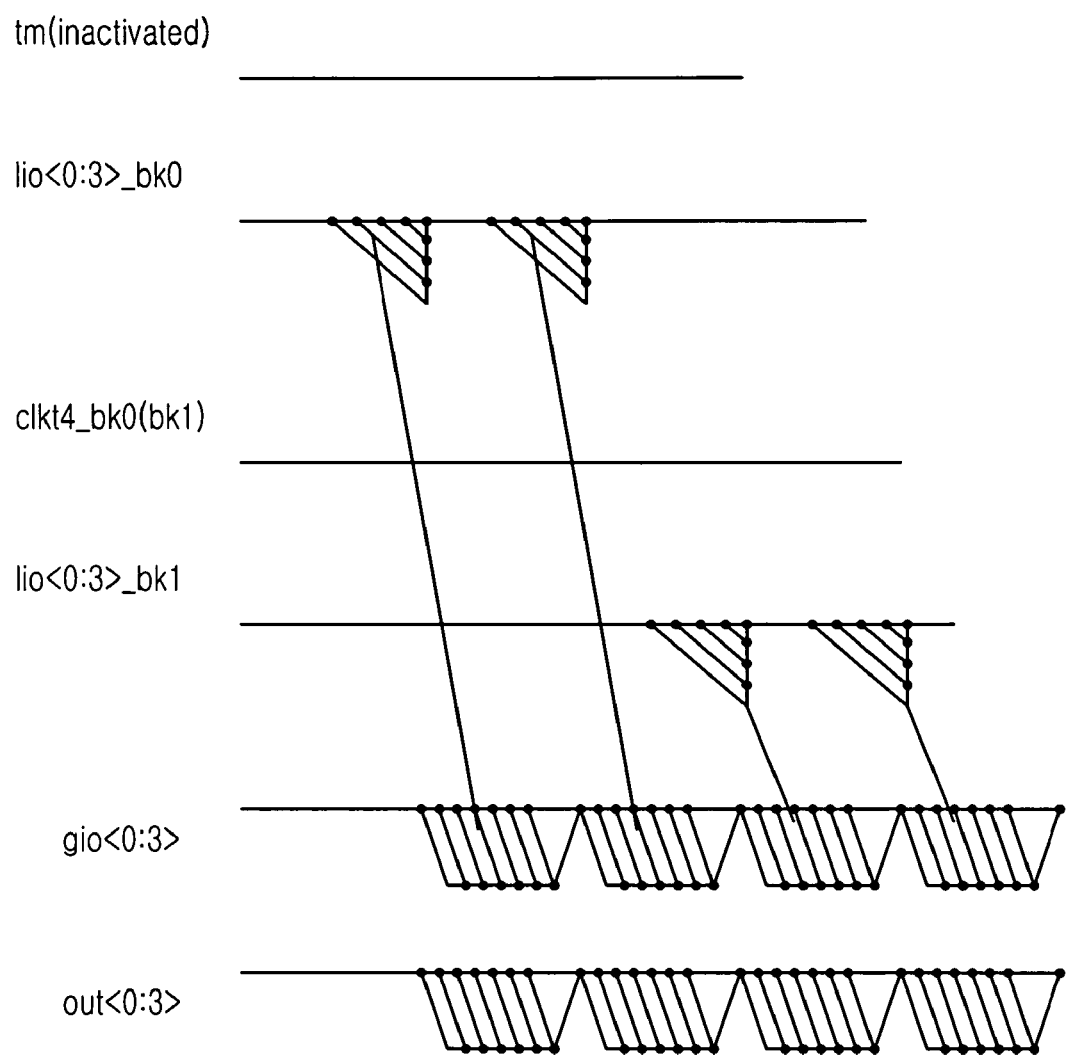

FIGS. 5 and 6 are timing diagrams showing operations of the semiconductor memory device when the semiconductor memory device is in a test mode and a normal mode respectively according to the test mode signal tm.

As shown in FIG. 5, when the test mode signal tm is activated, the first switch 461 latches the data of the test global line tgio at a logic high level of the first delayed control clock signal clk4_bk0_d and then outputs the latched data to the first output line out0 at a falling edge of the first delayed control clock signal clk4_bk0_d. On the contrary, when the test mode signal tm is inactivated, the first switch 461 passes the data of the first global input/output line gio<0> to the first output line out0.

Likewise, when the test mode signal tm is activated, the second switch 463 latches the data of the test global line tgio at a logic low level of the second delayed control clock signal clk4_bk1_d and then outputs the latched data to the second output line out1 at a rising edge of the second delayed control clock signal clk4_bk1_d. On the contrary, when the test mode signal tm is inactivated, the second switch 463 passes the data of the second global input/output line gio<1> to the second output line out1.

Meanwhile, when the test mode signal tm is activated, the third and the fourth switches 465 and 467 precharge the third and the fourth output lines out2 and out3. When the test mode signal tm is inactivated, the third switch 465 passes the data of the third global input/output line gio<2> to the third output line out2 and the fourth switch 467 passes the data of the fourth global input/output line gio<3> to the forth output line out3.

Referring to FIGS. 4 to 6, operations of the semiconductor memory device are described below.

When the test mode signal tm is activated, the first and the second control clock signals clk4_bk0 and clk4_bk1 are generated as above-mentioned. Then, the first bank 411 outputs data having a predetermined logic level to the first bank first to the first bank fourth local input/output lines lio0_bk0 to lio3_bk0. Likewise, the second bank 421 outputs data having a predetermined logic level to the second bank first to the second bank fourth local input/output lines lio0_bk1 to lio3_bk1.

The data outputted to the first bank first to the first bank fourth local input/output lines lio0_bk0 to lio3_bk0 are amplified by the first input/output sense amplifier unit 415, and then the amplified data are transferred to the first switching unit 415 in order to be outputted to the first to the fourth global input/output lines gio<0> to gio<3>. Likewise, the data outputted to the second bank first to the second bank fourth local input/output lines lio0_bk1 to lio0_bk1 are amplified by the second input/output sense amplifier unit 423, and then the amplified data are transferred to the second switching unit 425 in order to be outputted to the first to the fourth global input/output lines gio<0> to gio<3>.

Herein, a plurality of switches included in the first switching unit 415 transfers the data of the first bank first to the first bank fourth local input/output lines lio0_bk0 to lio3_bk0 in synchronization with the first control clock signal clk4_bk0. At this time, since each output of a plurality of switches included in the second switching unit 425 becomes a high impedance, there occurs no data collision between the data outputted from the first bank unit 410 and the data outputted from the second bank unit 420.

Meanwhile, the plurality of switches included in the second switching unit 425 transfers the data of the second bank first to the second bank fourth local input/output lines lio0_bk1 to lio3_bk1 to the first to the fourth global input/output lines gio<0> to gio<3> in synchronization with the second control clock signal clk4_bk1. At this time, each output of the plurality of switches included in the first switching unit 415 becomes a high impedance.

Figure 1:
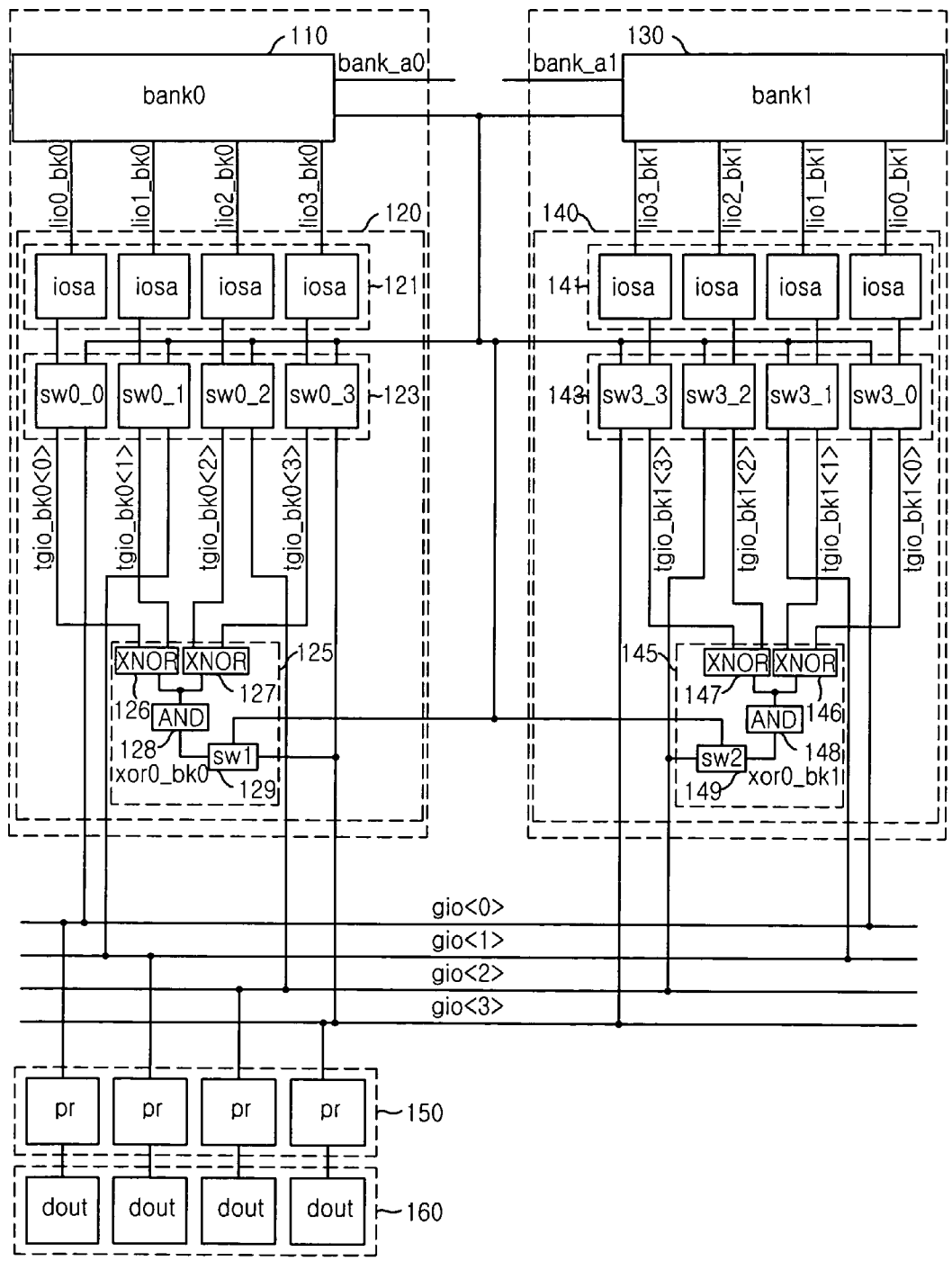
FIG. 1 is a block diagram showing a conventional single data rate synchronous semiconductor memory (SDR SDRAM) device for testing a memory cell.
Figure 2:
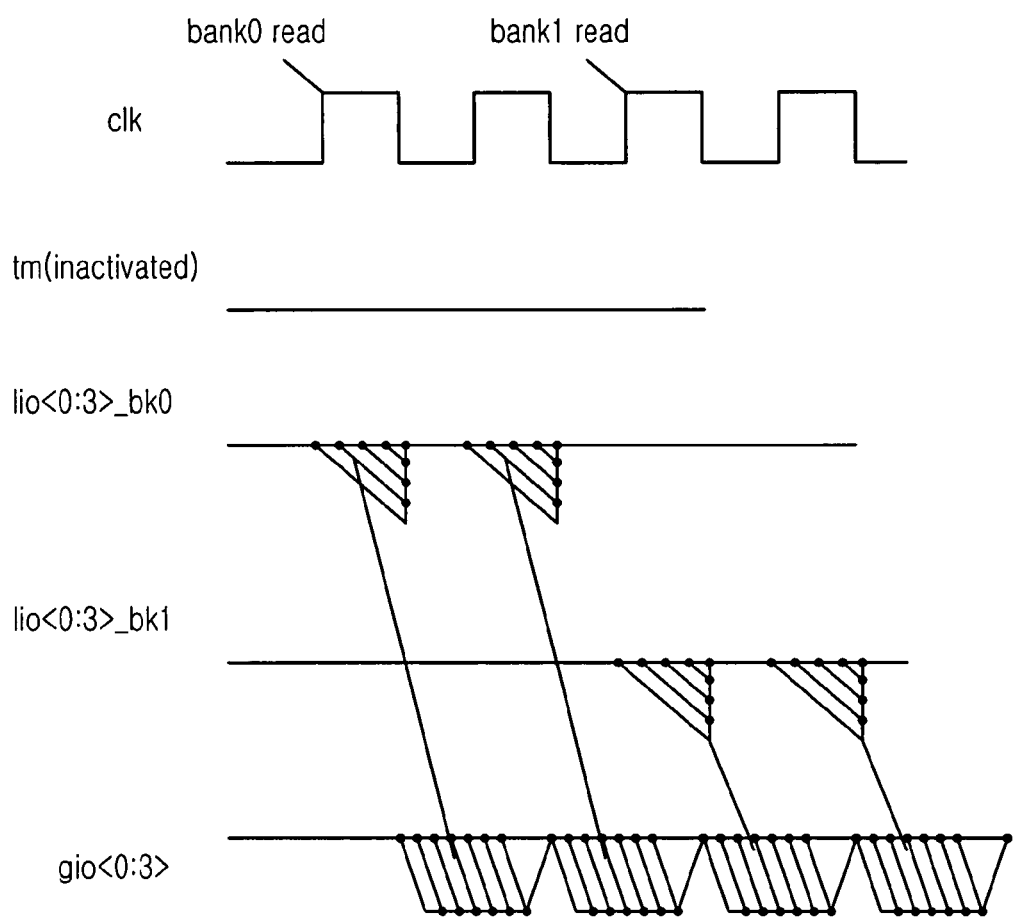
FIG. 2 is a timing diagram showing operations of the conventional SDR SDRAM shown in FIG. 1.
Figure 3:
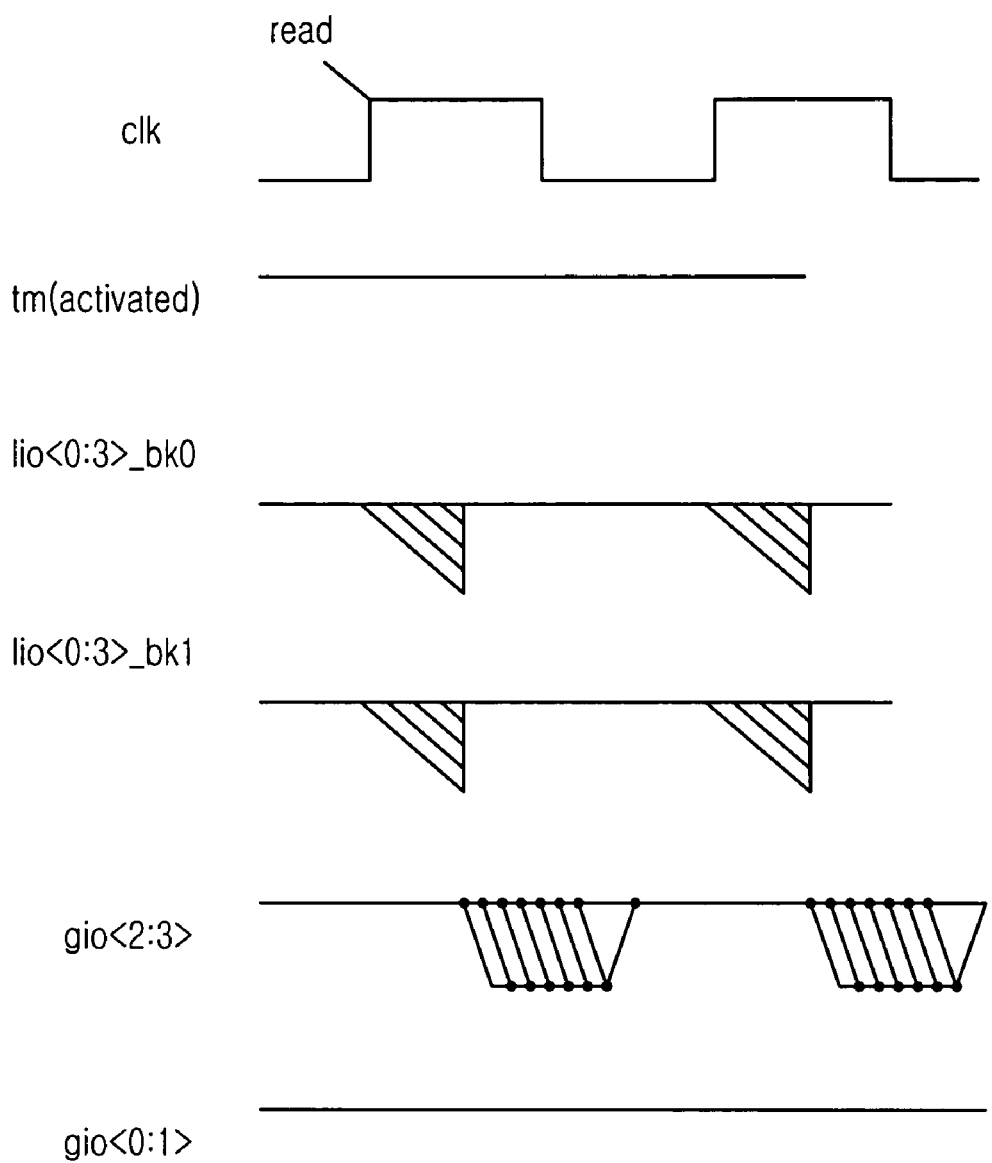
FIG. 3 is a timing diagram showing other operations of the conventional SDR SDRAM shown in FIG. 1.

The logic operation unit 450 performs logic operations to the data loaded on the first to the fourth global input/output lines gio<0> to gio<3>. That is, if all the data loaded on the first to the fourth global input/output lines gio<0> to gio<3> are the same, an output of the logic operation unit 450 becomes a logic high level. On the contrary, if one or more of the data loaded on the first to the fourth global input/output lines gio<0> to gio<3> has a different logic value, the output of the logic operation unit 450 becomes a logic low level. This operation is the same to that of the conventional SDR SDRAM shown in FIG. 1.

Herein, as shown in FIG. 5, the data outputted from the first bank unit 410 and the data outputted from the second bank unit 420 are alternately outputted to the first to the fourth global input/output lines gio<0> to gio<3> in response to the first control clock signal clk4_bk0 and the second control clock signal clk4_bk1 respectively.

Figure 7:
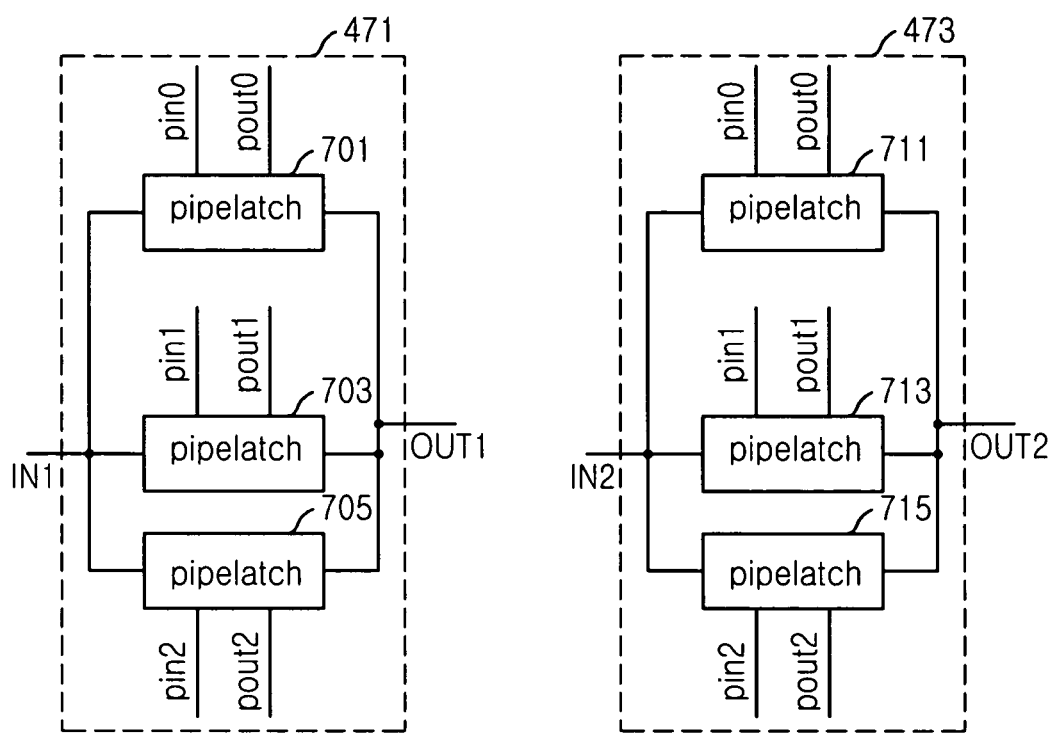
FIG. 7 is a block diagram showing a first pipe line and a second pipe line included in a pipe line unit shown in FIG. 4.

FIG. 7 is a block diagram showing a first pipe line 471 and a second pipe line 473 included in the pipe line unit 470 shown in FIG. 4.

As shown, the first pipe line 471 includes a first to a third pipe latches 701 to 703 connected in parallel between a first input node IN1 and a first output node OUT1. The first pipe latch 701 receives a first input control signal pin0 and a first output control signal pout0. Likewise, the second pipe latch 703 receives a second input control signal pin1 and a second output control signal pout1. The third pipe latch 705 receives a third input control signal pin2 and a third output control signal pout2.

Similarly, the second pipe line 473 includes a fourth to a sixth pipe latches 711 to 715 connected in parallel between a second input node IN1 and a second output node OUT2. The fourth to the sixth pipe latches 711 to 715 receive the first to the third input control signals pin0 to pin2 respectively. Also, the fourth to the sixth pipe latches 711 to 715 receive the first to the third output control signals pout0 to pout2 respectively.

Meanwhile, the first input node IN1 and the second input node IN2 are respectively connected to the first and the second output lines out0 and out1.

The first and the fourth pipe latches 701 and 711 latch the data outputted from the first switch 461 and the second switch 463 respectively when the first input control signal pin0 is activated as a logic low level, and then output the lathed data when the first input control signal pin0 is inactivated as a logic low level. Likewise, the second and the fifth pipe latches 703 and 713 latch data and then output the latched data in response to the second input control signal pin1. Also, the third and the sixth pipe latches 705 and 715 are operated in the same way.

Figure 8:
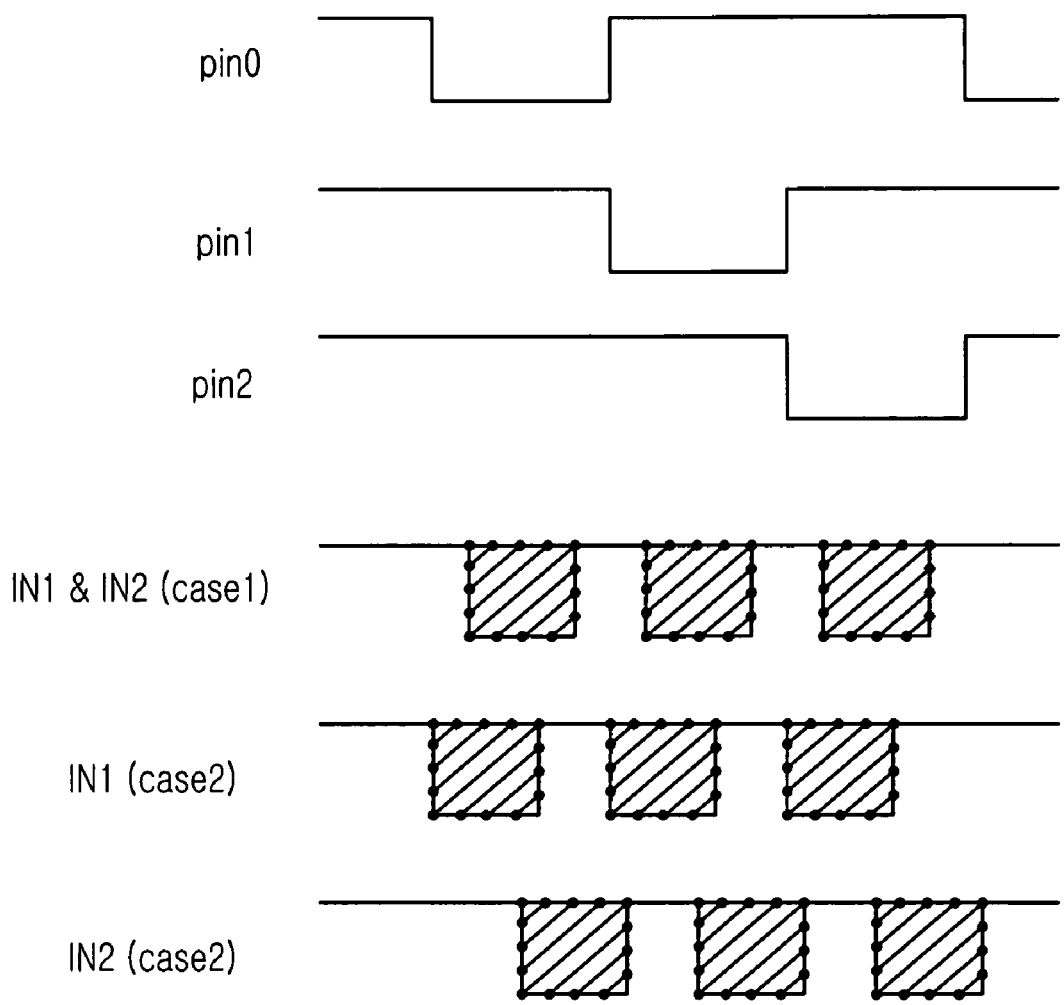
FIG. 8 is a timing diagram showing operations of the first and the second pipe lines shown in FIG. 7.

FIG. 8 is a timing diagram showing operations of the first and the second pipe lines 471 and 473 shown in FIG. 7.

As shown, the first to the third input control signals pin0 to pin2 are generated having a constant period. In detail, the first input control signal pin0 is activated as a logic low level when the second input control signal pin2 is inactivated as a logic high level and then is inactivated as a logic high level at a next clock edge of the internal clock signal clk. At this time, i.e., when the first input control signal pin0 is inactivated as a logic high level, the second input control signal pin1 is activated as a logic high level and then is inactivated as a logic high level at a next clock edge of the internal clock signal clk. When the second input control signal pin1 is inactivated as a logic high level, the third input control signal pin2 is activated as a logic low level. Then, the third input control signal pin2 is inactivated as a logic high level at a next clock edge of the internal clock signal clk. At this time, the first input control signal pin0 is activated as a logic low level as above-mentioned.

As shown in FIG. 8, when the first input control signal pin0 is activated as a logic low level, a first data outputted to the first output line out0 is latched by the first pipe latch 701 and a first data outputted to the second output line out1 is latched by the fourth pipe patch 711. Similarly, when the second input control signal pin1 is activated as a logic low level, a second data outputted to the first output line out0 is latched by the second pipe latch 703 and a second data outputted to the second output line out1 is latched by the fifth pipe latch 713. Herein, for stably performing the above-mentioned operation, it is preferable that the data outputted to the first and the second output lines out0 and out1 are latched by the first and the second pipe lines 471 and 473 at the same timing as shown in the CASE 1.

Therefore, in accordance with the present invention, since a plurality of banks can share a test circuit for testing a memory cell, a size of a semiconductor memory device can be reduced. Although the present invention has been explained with a particular semiconductor memory device having two banks, the present invention can be employed to various semiconductor memory devices which include more than two banks.

The present application contains subject matter related to Korean patent application No. 2004-82548, filed in the Korean Patent Office on Oct. 15, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A memory cell test circuit for use in a semiconductor memory device having a plurality of banks connected to a plurality of global input/output lines, comprising:
   a plurality of bank switching units for transferring data outputted from the corresponding bank to the plurality of global input/output lines based on a test mode signal and a plurality of control clock signals;
   a single logic operation unit for logically combining the data of global input/output lines and for outputting a test result to a single test global input/output line; and
   a switching unit coupled to the single test global input/output line and the plurality of global input/output lines for selectively passing the test result of the single test global input/output line and the data of the global input/output lines based on the test mode signal and the plurality of control clock signals.

2. The memory cell test circuit as recited in claim 1, wherein each of the plurality of banks outputs data as a same logic level to a plurality of local input/output lines at a test mode based on the test mode signal.

3. The memory cell test circuit as recited in claim 2, wherein each of the plurality of bank switching units outputs data at different timings in synchronization with one of the plurality of control clock signals during the test mode.

4. The memory cell test circuit as recited in claim 3, wherein each of the plurality of bank switching units outputs high impedance during not outputting data in response to one of the plurality of control clock signals.

5. The memory cell test circuit as recited in claim 4, further comprising:
   a multiple clock generation unit for generating the plurality of control clock signals based on an input clock signal and the test mode signal.

6. The memory cell test circuit as recited in claim 5, wherein the multiple clock generation unit is enabled when the test mode signal is activated or is disabled when the test mode signal is inactivated.

7. The memory cell test circuit as recited in claim 6, further comprising:
   a plurality of input/output sense amplifier units each of which connected between one of the plurality of banks and one of the plurality of bank switching units having a plurality of input/output sense amplifiers for amplifying the data outputted from the plurality of banks and for transferring the amplified data to the plurality of bank switching units.

8. The memory cell test circuit as recited in claim 7, wherein each of the plurality of bank switching units includes a plurality of bank switches each of which connected to one of the plurality of input/output sense amplifiers and receives the test mode signal and one of the plurality of control clock signals.

9. The memory cell test circuit as recited in claim 8, the plurality of bank switching units included in one bank switching units output the amplified data at a first edge of a corresponded control clock signal and output high impedance at a second edge of the corresponded control clock signal during the test mode.

10. The memory cell test circuit as recited in claim 9, wherein the number of the plurality of global input/output lines is four and the logic operation unit includes:
    a first exclusive NOR gate for receiving a data of a first and a second global input/output lines;
    a second exclusive NOR gate for receiving a data of a third and a fourth global input/output lines; and
    an AND gate for performing a logic AND operation to an output of the first exclusive NOR gate and an output of the second exclusive NOR gate.

11. The memory cell test circuit as recited in claim 9, wherein, at the test mode, the AND gate outputs a logic high data to the single test global input/output line when all of the data of the first to the fourth global input/output lines are the same logic level or outputs a logic low data to the single test global input/output line when one or more of the data of the first to the fourth global input/output lines are different logic level.

12. The memory cell test circuit as recited in claim 11, wherein the switching unit includes:
    a first switch coupled to the single test global input/output line and the first global input output line for selectively output data of the single test global input/output line and data of the first global input/output line in response to the test mode signal and a first control clock signal;

a second switch coupled to the single test global input/output line and the second global input output line for selectively output data of the test global/input output line and data of the second global input/output line in response to the test mode signal and a second control clock signal;

a third switch coupled to the third global input/output line for passing data of the third global input/output line in response to the test mode signal; and a fourth switch coupled to the fourth global input/output line for passing data of the fourth input/output lines in response to the test mode signal.

13. The memory cell test circuit as recited in claim 12, wherein, at the test mode, the first switch latches the data of the single test global input/output line during a low level of the first control clock signal and outputs the latched data during a high level of the first control clock signal.

14. The memory cell test circuit as recited in claim 13, wherein, at the test mode, the second switch latches the data of the single test global input/output line during a low level of the second control clock signal and outputs the latched data during a high level of the second control clock signal.

15. The memory cell test circuit as recited in claim 14, wherein the first switch passes the data of the first global input/output line when the test mode signal is inactivated.

16. The memory cell test circuit as recited in claim 15, wherein the second switch passes the data of the second global input/output line when the test mode signal is inactivated.

17. The memory cell test circuit as recited in claim 16, wherein the third switch passes the data of the third global input/output line when the test mode signal is inactivated.

18. The memory cell test circuit as recited in claim 17, wherein the fourth switch passes the data of the fourth global input/output line when the test mode signal is inactivated.

19. The memory cell test circuit as recited in claim 18, wherein the third switch and the fourth switch output high impedance during the test mode.

20. The memory cell test circuit as recited in claim 19, further comprising:

a pipe line unit coupled to the switching unit for receiving output signals of the switching unit and for outputting the received signals.

21. The memory cell test circuit as recited in claim 20, wherein the pipe line unit includes:

a first pipe line coupled to the first switch for latching and outputting an output data of the first switch;

a second pipe line coupled to the second switch for latching and outputting an output data of the second switch;

a third pipe line coupled to the third switch for latching and outputting an output data of the second switch; and a fourth pipe line coupled to the fourth switch for latching and outputting an output data of the fourth switch.

22. The memory cell test circuit as recited in claim 21, wherein the first pipe line includes:

a first pipe latch for latching and outputting the output data of the first switch in response to a first input control signal and a first output control signal;

a second pipe latch for latching and outputting the output data of the first switch in response to the first input control signal and the first output control signal; and a third pipe latch for latching and outputting the output data of the first switch in response to the first input control signal and the first output control signal.

23. The memory cell test circuit as recited in claim 22, wherein the second pipe line includes:

a fourth pipe latch for latching and outputting the output data of the second switch in response to a first input control signal and a first output control signal;

a fifth pipe latch for latching and outputting the output data of the second switch in response to the first input control signal and the first output control signal; and a sixth pipe latch for latching and outputting the output data of the third switch in response to the first input control signal and the first output control signal.

24. A method for testing a memory cell included in a semiconductor memory device having a plurality of banks, comprising the steps of:

a) generating a first control clock signal and a second control clock signal based on a test mode signal and an input clock signal;

b) outputting data from the plurality of banks as a same logic level to a plurality of local input/output lines of the plurality of banks in response to the test mode signal;

c) outputting data outputted from the plurality of local input/output lines to a first to a fourth global input/output lines in response to a first control clock signal and a second control clock signal; and d) performing a logic operation to data of the first to the fourth global input/output lines and outputting a single result of the logic operation to a single test global input/output line.

25. The method for testing a memory cell as recited in claim 24, wherein the step of d) further includes the steps of:

e) performing a first logic exclusive NOR operation to data of the first global input/output line and data of the second global input/output line;

f) performing a second logic exclusive NOR operation to data of the third global input/output line and data of the fourth global input/output line; and g) performing a logic AND operation to a result of the first logic exclusive NOR operation and a result of the second logic exclusive NOR operation and outputting a result of the logic AND operation to the single test global input/output line.

26. The method for testing a memory cell as recited in claim 25, further comprising the steps of:

h) latching and outputting data of the single test global input/output line in response to the first control clock signal and the second control clock signal.

27. The method for testing a memory cell as recited in claim 24, wherein the step of a) includes the steps of:

i) generating the first control clock signal in synchronization with a rising edge of the input clock signal; and j) generating the second control clock signal in synchronization with a falling edge of the first control clock signal.

* * * * *